(12) United States Patent　　(10) Patent No.: US 6,924,535 B2
Hayashi　　(45) Date of Patent: Aug. 2, 2005

(54) SEMICONDUCTOR DEVICE WITH HIGH AND LOW BREAKDOWN VOLTAGE TRANSISTORS

(75) Inventor: Masahiro Hayashi, Sakata (JP)

(73) Assignee: Seiko Epson Corporation (JP)

( * ) Notice: Subject to any disclaimer, the term of this patent is extended or adjusted under 35 U.S.C. 154(b) by 58 days.

(21) Appl. No.: 10/382,112

(22) Filed: Mar. 5, 2003

(65) Prior Publication Data

US 2003/0173638 A1 Sep. 18, 2003

(30) Foreign Application Priority Data

Mar. 6, 2002　(JP) ........................................ 2002-060488

(51) Int. Cl.[7] .............................................. H01L 29/94
(52) U.S. Cl. ........................ 257/371; 257/368; 257/369; 257/500
(58) Field of Search ................................ 257/371, 368, 257/369, 500, 501, 509, 511

(56) References Cited

U.S. PATENT DOCUMENTS

| 4,038,680 | A | * | 7/1977 | Yagi et al. ................... | 257/555 |
|---|---|---|---|---|---|
| 4,202,006 | A | * | 5/1980 | Khajezadeh ................. | 257/550 |
| 4,258,379 | A | * | 3/1981 | Watanabe et al. ........... | 257/574 |
| 4,536,784 | A | * | 8/1985 | Nagumo et al. ............. | 257/535 |
| 4,940,671 | A | * | 7/1990 | Small et al. ................. | 438/322 |
| 5,475,335 | A | * | 12/1995 | Merrill et al. ............... | 327/536 |
| 5,537,075 | A | * | 7/1996 | Miyazaki ..................... | 327/566 |
| 5,920,089 | A | * | 7/1999 | Kanazawa et al. .......... | 257/202 |
| 5,976,940 | A | * | 11/1999 | Gomi et al. ................. | 438/340 |
| 6,207,998 | B1 | * | 3/2001 | Kawasaki et al. ........... | 257/371 |
| 6,208,010 | B1 | * | 3/2001 | Nakazato et al. ............ | 257/544 |
| 6,258,641 | B1 | * | 7/2001 | Wong et al. ................. | 438/199 |
| 6,320,234 | B1 | * | 11/2001 | Karasawa et al. ........... | 257/371 |
| 6,329,693 | B1 | * | 12/2001 | Kumagai ..................... | 257/371 |
| 6,403,992 | B1 | * | 6/2002 | Wei ............................. | 257/204 |
| 6,462,385 | B1 | * | 10/2002 | Kumagai ..................... | 257/372 |

FOREIGN PATENT DOCUMENTS

| JP |  | 01-268171 | 10/1989 |  |  |
|---|---|---|---|---|---|
| JP |  | 07-078881 | 3/1995 |  |  |
| JP |  | 08-274268 | 10/1996 |  |  |
| JP |  | 2000-286346 | 10/2000 |  |  |
| JP |  | 2000286346 | A * | 10/2000 | ....... H01L/21/8238 |
| JP |  | 2000-294742 | 10/2000 |  |  |
| JP |  | 2001-291678 | 10/2001 |  |  |
| JP |  | 2001-291679 | 10/2001 |  |  |
| JP |  | 2001-291786 | 10/2001 |  |  |

* cited by examiner

*Primary Examiner*—George Eckert
*Assistant Examiner*—Eugene Lee
(74) *Attorney, Agent, or Firm*—Harness, Dickey & Pierce, P.L.C.

(57) ABSTRACT

A semiconductor device, having a high breakdown voltage transistor and a low breakdown voltage transistor in a common substrate with different driving voltages, includes a semiconductor substrate of a first conductivity type, a first triple well formed in the semiconductor substrate and having a first well of a second conductivity type and a second well of the first conductivity type formed within the first well, a second triple well formed in the semiconductor substrate and having a third well of the second conductivity type and a fourth well of the first conductivity type formed within the third well, a low breakdown voltage transistor of the second conductivity type formed at the second well, and a high breakdown voltage transistor of the second conductivity type formed at the fourth well. The first well of the first triple well can have an impurity concentration higher than an impurity concentration of the third well of the second triple well.

10 Claims, 4 Drawing Sheets

SEMICONDUCTOR DEVICE WITH HIGH AND LOW BREAKDOWN VOLTAGE TRANSISTORS

TECHNICAL FIELD

The present invention relates to a semiconductor device having a high breakdown voltage transistor and a low breakdown voltage transistor in a common semiconductor substrate.

BACKGROUND

A liquid crystal panel driver LSI and a CCD driver LSI, for example, are operated at a power supply voltage of 10V or higher, and therefore high breakdown voltage transistors having a breakdown voltage of 20V or higher are normally required. On the other hand, low breakdown voltage transistors are used in internal control logic sections that need to be small in size and high speed. Wells where high breakdown voltage transistors are formed need to be made deeper in order to secure the well breakdown voltage. In contrast, wells where low breakdown voltage transistors are formed tend to be made shallower in order to reduce the element size and to achieve higher speeds. For this reason, high breakdown voltage transistors are formed in a chip that is different from a chip for low breakdown voltage transistors, and are known to be formed as an externally mounted circuit.

SUMMARY

An embodiment of the present invention provides a semiconductor device having a high breakdown voltage transistor and a low breakdown voltage transistor in a common substrate with different driving voltages.

An embodiment of the present invention provides a semiconductor device comprising: a semiconductor substrate of a first conductivity type; a first triple well formed in the semiconductor substrate, and having a first well of a second conductivity type and a second well of the first conductivity type formed within the first well; a second triple well formed in the semiconductor substrate, and having a third well of the second conductivity type and a fourth well of the first conductivity type formed within the third well; a low breakdown-strength transistor of the second conductivity type formed at the second well of the first triple well; and a high breakdown-strength transistor of the second conductivity type formed at the fourth well of the second triple well, wherein the first well of the first triple well has an impurity concentration higher than an impurity concentration of the third well of the second triple well.

According to such an embodiment of a semiconductor device, the second well of the first triple well and the fourth well of the second triple well are both electrically isolated from the semiconductor substrate. For this reason, a different bias condition can be set independently for each of the wells. As a result, both of the low breakdown voltage transistor and the high breakdown voltage transistor are not restrained by the substrate potential, and can be driven at different power supply voltages. In accordance with other embodiments of the present invention, a semiconductor device can include a high breakdown voltage transistor driven at a high power supply voltage of about 20–60 V, in particular, and a low breakdown voltage transistor driven at a power supply voltage of, for example, about 1.8–8 V.

A semiconductor device in accordance with another embodiment of the present invention may further include a low breakdown voltage transistor of the first conductivity type formed at the first well of the first triple well, and a high breakdown voltage transistor of the first conductivity type formed at the third well of the second triple well.

In a semiconductor device in accordance with another embodiment of the present invention, a ratio of the breakdown voltages of the low breakdown voltage transistor and the high breakdown voltage transistor may be about 3 to 60. Also, the high breakdown voltage transistor may have an offset gate structure.

Additional features and advantages of the invention will be more fully apparent from the following detailed description of example embodiments, the accompanying drawings and the associated claims.

The accompanying drawings are: intended to depict example embodiments of the invention and should not be interpreted to limit the scope thereof; and not to be considered as drawn to scale unless explicitly noted.

DETAILED DESCRIPTION

Figure 1:
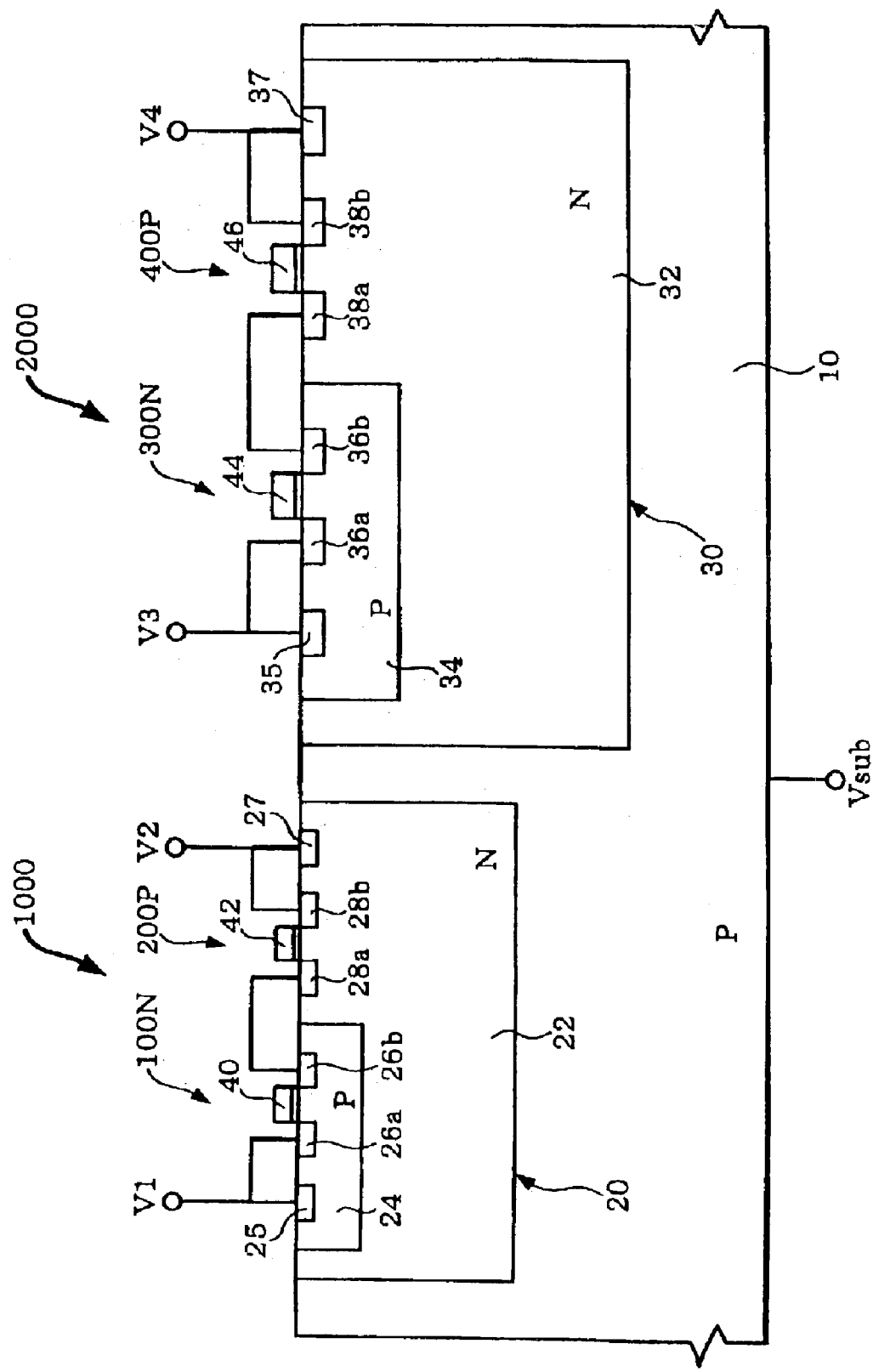
FIG. 1 schematically shows a cross-sectional view of a semiconductor device in accordance with one embodiment of the present invention.

FIG. 1 schematically shows a cross-sectional view of a semiconductor device in accordance with an embodiment of the present invention.

The semiconductor device shown in FIG. 1 includes a region where low breakdown voltage transistors are formed (hereafter referred to as a "low breakdown voltage transistor region") 1000 and a region where high breakdown voltage transistors are formed (hereafter referred to as a "high breakdown voltage transistor region") 2000, which are formed in a semiconductor (e.g., silicon) substrate 10 of a first conductivity type (P-type in this example). A first triple well 20 is formed in the low breakdown voltage transistor region 1000, and a second triple well 30 is formed in the high breakdown voltage transistor region 2000.

The first triple well 20 includes a first well 22 of a second conductivity type (N-type in this example) and a second well 24 of P-type formed within the first well 22.

In the second well 24, an N-channel type low breakdown voltage transistor 100N and a P-type well contact layer 25 are formed. The impurity concentration in the second well 24 can be relatively lower (P$^-$) as compared to the contact layer 25 (P$^+$). The low breakdown voltage transistor 100N includes source/drain layers 26a and 26b formed with an N-type impurity, and a gate electrode 40.

In the first well 22, a P-channel type low breakdown voltage transistor 200P and an N-type well contact layer 27 are formed. The impurity concentration in the first well 22 can be relatively lower (N$^-$) as compared to the contact layer 27 (N$^+$). The low breakdown voltage transistor 200P includes source/drain layers 28a and 28b formed with a P-type impurity, and a gate electrode 42.

The second triple well 30 includes a third well 32 of N-type, and a fourth well 34 of P-type formed within the third well 32.

In the fourth well 34, an N-channel type high breakdown voltage transistor 300N and a P-type well contact layer 35 are formed. The impurity concentration on the fourth well 34 can be relatively lower (P⁻) as compared to the contact layer 35 (P⁺). The high breakdown voltage transistor 300N includes source/drain layers 36a and 36b formed with an N-type impurity, and a gate electrode 44.

In the third well 32, a P-channel type high breakdown voltage transistor 400P and an N-type well contact layer 37 are formed. The impurity concentration is the third well 32 can be relatively lower (N⁻) as compared to the contact layer 37 (N⁺). The high breakdown voltage transistor 400P includes source/drain layers 38a and 38b formed with a P-type impurity, and a gate electrode 46.

The layers 26a, 26b, 27, 36a, 36b and 37 can be formed by the same ion implantation process. Hence, they can be of the same impurity concentration, namely N⁺. Similarly, the layers 25, 28a, 28b, 36, 36a and 36b can be of the same impurity concentration, namely P⁺.

In accordance with the present embodiment, the low breakdown voltage transistors 100N and 200P that are formed in the low breakdown voltage transistor region 1000 are driven by a driving voltage of, for example, about 1.8–8V. The high breakdown voltage transistors 300N and 400P that are formed in the high breakdown voltage transistor region 2000 are driven by a substantially high driving voltage compared to those of the low breakdown voltage transistors 100N and 200P, for example, by a driving voltage of about 10–60V. A ratio of the breakdown voltages between the low breakdown voltage transistor 100N, 200P and the high breakdown voltage transistor 300N, 400P, i.e., (a breakdown voltage of a high breakdown voltage transistor)/(a breakdown voltage of a low breakdown voltage transistor) is, for example, about 30–60. The "breakdown voltage" typically means a drain breakdown voltage.

The structure of each of the wells can be determined based on breakdown voltage and threshold value of transistors provided in each well and junction breakdown voltage and punch-through breakdown voltage between the wells.

First, impurity concentrations of the wells are described. The impurity concentration of the first well 22 and the second well 24 in the low breakdown voltage transistor region 1000 is set higher than the impurity concentration of the third well 32 and the fourth well 34 in the high breakdown voltage transistor region 2000. The impurity concentration of the first well 22 and the second well 24, for example in their surface concentration, is about $4.0 \times 10^{16}$–$7.0 \times 10^{17}$ atoms/cm³. The impurity concentration of the third well 32 and the fourth well 34, for example in their surface concentration, is about $8.0 \times 10^{15}$–$4.0 \times 10^{16}$ atoms/cm³.

With respect to the well depth, in view of the well breakdown voltage, the first well 22 in the low breakdown voltage transistor region 1000 may preferably be set shallower than the third well 32 in the high breakdown voltage transistor region 2000. For example, the first well 22 has a depth of about 3–10 μm, and the third well 32 has a depth of about 10–20 μm. As the depth of the first well 22 and the depth of the third well 32 are compared, a depth ratio of the two is, for example about 2–6.

The transistors shown in FIG. 1 are isolated from one another by element isolation dielectric layers (not shown). Also, adjacent ones of the transistor and well contact layer are isolated from one another by element isolation dielectric layers (not shown).

In the high breakdown voltage transistor region 2000, each of the high breakdown voltage transistors 300N and 400N may have a so-called offset gate structure in which the gate electrode does not overlap with its source/drain layers. In an example described below, each high breakdown voltage transistor has a LOCOS offset structure. More specifically, in each of the high breakdown voltage transistors, an offset region is provided between a gate electrode and source/drain layers. The offset region can be formed of a low concentration impurity layer below the offset LOCOS layer that is provided in a specified region on the semiconductor substrate.

Figure 2:
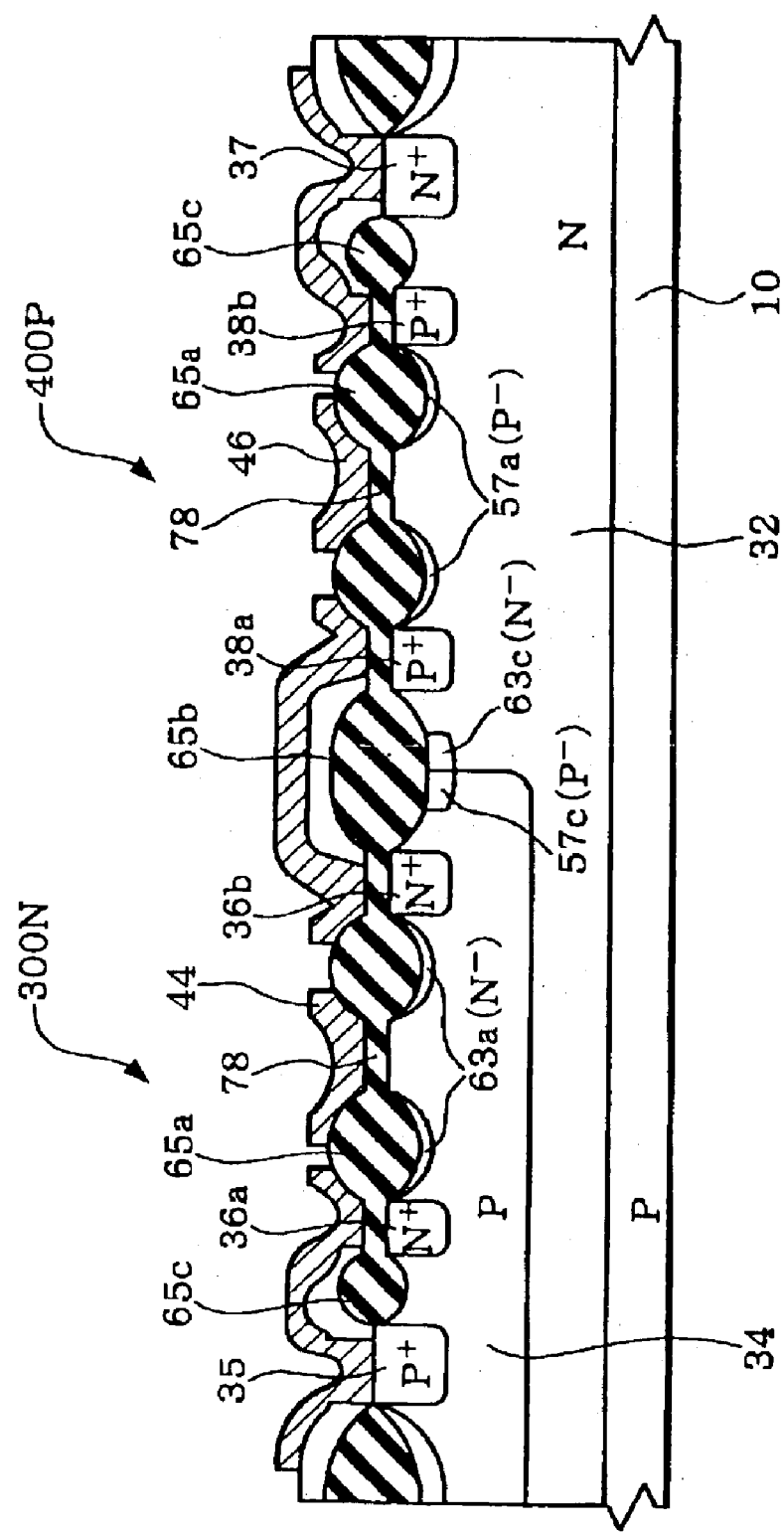
FIG. 2 schematically shows a cross-sectional view of the structure of a high breakdown-strength transistor region shown in FIG. 1.
Figure 3:
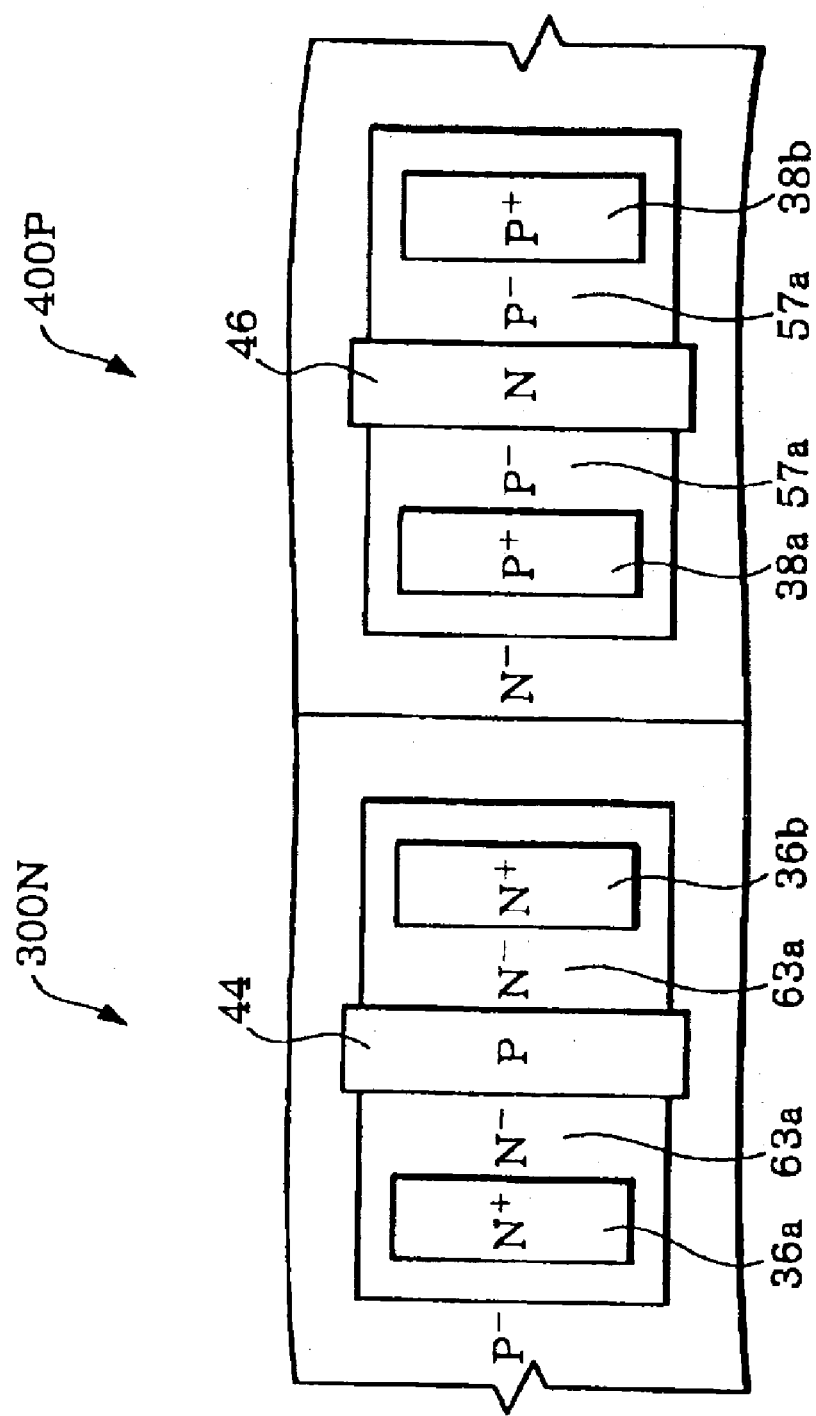
FIG. 3 schematically shows a plan view of main sections of the high breakdown-strength transistor region shown in FIG. 1.

FIG. 2 shows a cross-sectional view of the structure of the high breakdown voltage transistors 300N and 400P. FIG. 3 shows a plan view of main sections of the high breakdown voltage transistors 300N and 400P.

The N-channel type high breakdown voltage transistor 300N includes a gate dielectric layer 78 provided over the P-type fourth well 34, a gate electrode 44 formed over the gate dielectric layer 78, an offset LOCOS layer 65a provided around the gate dielectric layer 78, an offset impurity layer 63a formed with an N-type low concentration impurity and located below the offset LOCOS layer 65a, and source/drain layers 36a and 36b provided on the outside of the offset LOCOS layer 65a.

The P-channel type high breakdown voltage transistor 400P includes a gate dielectric layer 78 provided over the N-type third well 32, a gate electrode 46 formed over the gate dielectric layer 78, an offset LOCOS layer 65a provided around the gate dielectric layer 78, an offset impurity layer 57a formed with a P-type low concentration impurity and located below the offset LOCOS layer 65a, and source/drain layers 38a and 38b provided on the outside of the offset LOCOS layer 65a.

The gate dielectric layer 78 of each of the high breakdown voltage transistors 300N and 400P may preferably have a film thickness of about 60–200 nm, although it depends on the breakdown voltage required for the transistor when, e.g., a voltage of about 10 V or greater, more specifically, a voltage of about 10–60V is applied.

The N-channel type high breakdown voltage transistor 300N and the P-channel type high breakdown voltage transistor 400P are electrically isolated from each other by an element isolation LOCOS layer (element isolation dielectric layer) 65b. The element isolation LOCOS layer 65b is provided over a boundary between the P-type fourth well 34 and the N-type third well 32. Further, a channel stopper layer 57c formed with a P-type low concentration impurity is located below the element isolation LOCOS layer 65b within the P-type fourth well 34, and a channel stopper layer 63c formed with an N-type low concentration impurity is located below the element isolation LOCOS layer 65b within the N-type third well 32.

The well contact layers 35 and 37 are isolated from the respective source/drain layer 36a and 38b by the LOCOS layers 65c, respectively. A channel stopper layer (not shown) can be formed below the LOCOS layer 65c.

In the present embodiment, each of the high breakdown voltage transistors has a LOCOS offset structure and therefore has a high drain breakdown voltage, such that a high breakdown voltage MOSFET can be obtained. In other words, by providing the offset (low concentration) impurity layers 63a and 57a below the offset LOCOS layer 65a, the offset impurity layers 63a and 57a can be made relatively deep against the channel region, compared to the case without the offset LOCOS layer. As a result, when the transistor is in an OFF state, a deep depletion layer can be formed because of the offset impurity layers 63a or 57a, and a drain breakdown voltage can be increased as the electric field adjacent to the drain electrode is alleviated.

In the semiconductor device in accordance with the present embodiment, the first triple well 20 is formed in the low breakdown voltage transistor region 1000, and the second triple well 30 is formed in the high breakdown voltage transistor region 2000. Accordingly, the second well 24 of the first triple well 20 and the fourth well 34 of the second triple well 30 are both electrically isolated from the semiconductor substrate 10. For this reason, a bias condition can be set independently for each of the wells.

Figure 4:
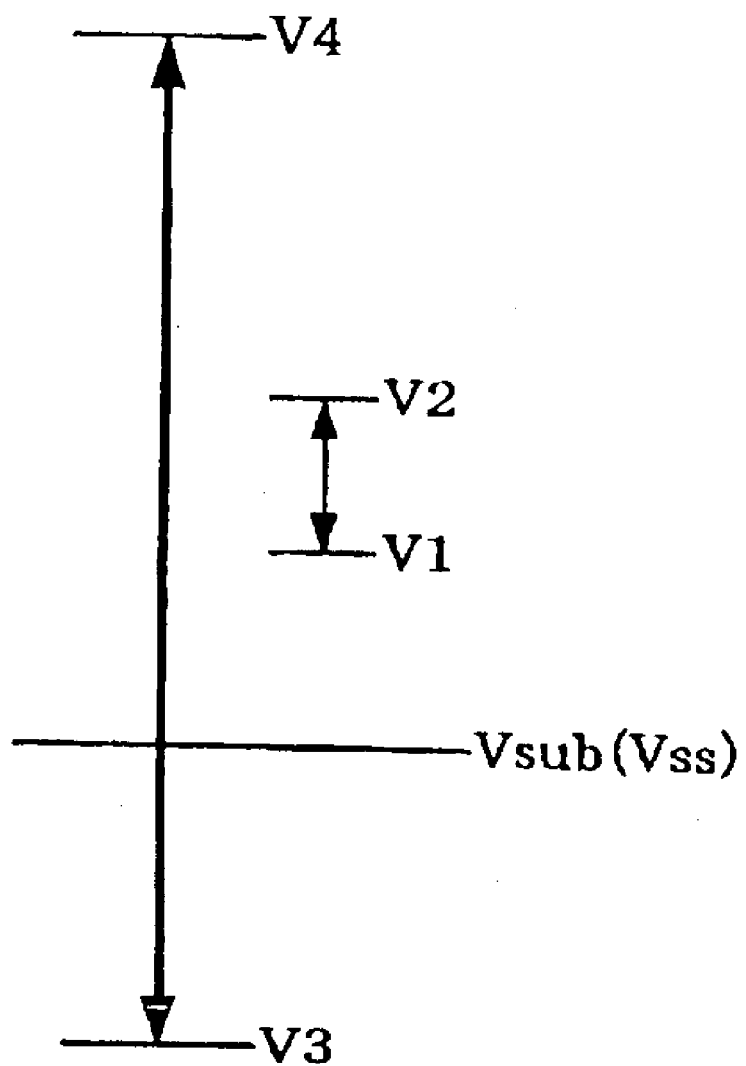
FIG. 4 shows relations between driving voltages among the transistors in the semiconductor device in accordance with another embodiment of the present invention.

In the high breakdown voltage transistor region 2000, driving voltages for the third well 32 and the fourth well 34 can be set independently of the substrate potential Vsub of the semiconductor substrate 10. Therefore, for example, as shown in FIG. 4, a driving voltage V3 for the N-channel type high breakdown voltage transistor 300N and a driving voltage V4 for the P-channel type high breakdown voltage transistor 400P can be set on a negative side and a positive side, respectively, with respect to the substrate potential Vsub, and therefore a high breakdown voltage CMOS (complementary type MOS) transistor can be obtained. In this manner, a high breakdown voltage transistor in accordance with the present embodiment can be used even when a power supply voltage is for example about 10V or higher, and more particularly about 20–60V.

Also, in the low breakdown voltage transistor region 1000, driving voltages for the first well 22 and the second well 24 can be set independently of the substrate potential Vsub of the semiconductor substrate 10. Therefore, for example, as shown in FIG. 4, by setting driving voltages V1 and V2 of the low breakdown voltage transistors 100N and 200P intermediate the driving voltages V3 and V4 of the high breakdown voltage transistors 300N and 400P, a level shift circuit that shifts the driving voltage level for the low breakdown voltage transistor to the driving voltage level for the high breakdown voltage transistor can be effectively and readily designed.

The present invention is not limited to the embodiments described above, and many modifications can be made within the scope of the subject matter of the present invention. For example, the embodiments described above show examples in which the first conductivity type is P-type and the second conductivity type is N-type. However, they may have inverted conductivity types. Wells are not limited to triple wells, but single wells and twin wells can be further provided if necessary. Also, the layer structure or plan structure of the semiconductor device can be different from those of the embodiment described above depending on the design of devices.

The entire disclosure of Japanese Patent Application No. 2002-060488 filed Mar. 6, 2002 as incorporated by reference herein.

What is claimed is:

1. A semiconductor device comprising:
    a semiconductor substrate of a first conductivity type;
    a first triple well formed in the semiconductor substrate, and having a first well of a second conductivity type and a second well of the first conductivity type formed within the first well;
    a second triple well formed in the semiconductor substrate, and having a third well of the second conductivity type and a fourth well of the first conductivity type formed within the third well;
    a low breakdown voltage transistor of the second conductivity type formed at the second well of the first triple well; and
    a high breakdown voltage transistor of the second conductivity type formed at the fourth well of the second triple well,
    wherein the first well of the first triple well has an impurity concentration higher than an impurity concentration of the third well of the second triple well, the first well of the first triple well is shallower than the third well of the second triple well, and a ratio of the depths between the first well and the third well is about 2 to 6.

2. A semiconductor device according to claim 1, wherein the high breakdown voltage transistor has an offset gate structure.

3. A semiconductor device according to claim 2, further comprising:
    first segments of an offset LOCOS layer interposed between the fourth well and end portions of a gate electrode of the high breakdown voltage transistor at the fourth well; and
    second segments of an offset impurity layer of the second impurity type interposed between the fourth well and the first segments of the offset LOCOS layer.

4. A semiconductor device according to claim 3, further comprising:
    third segments of a dielectric layer interposed between the fourth well and a central portion of the gate electrode, the first segments of the offset LOCOS layer having been grown from the dielectric layer such that a transition between the first segments and the third segments is substantially continuous.

5. A semiconductor device according to claim 1, further comprising:
    a low breakdown voltage transistor of the first conductivity type formed at the first well of the first triple well; and
    a high breakdown voltage transistor of the first conductivity type formed at the third well of the second triple well.

6. A semiconductor device according to claim 5, wherein the high breakdown voltage transistor has an offset gate structure.

7. A semiconductor device according to claim 6, further comprising:
    first segments of an offset LOCOS layer interposed between the fourth well and end portions of a gate electrode of the high breakdown voltage transistor at the fourth well;
    second segments of a first offset impurity layer of the second impurity type interposed between the fourth well and the first segments of the offset LOCOS layer;
    third segments of the offset LOCOS layer interposed between the third well and end portions of a gate electrode of the high breakdown voltage transistor at the third well; and
    fourth segments of a second offset impurity layer of the first impurity type interposed between the third well and the third segments of the offset LOCOS layer.

8. A semiconductor device according to claim 7, further comprising:
    fifth segments of a dielectric layer interposed between the fourth well and a central portion of the gate electrode of the high breakdown voltage transistor at the fourth well; and sixth segments of the dielectric layer interposed between the third well and a central portion of the gate electrode of the high breakdown voltage transistor at the third well;

wherein the first segments of the offset LOCOS layer have been grown from the dielectric layer such that a transition between the first segments and the fifth segments is substantially continuous; and the third segments of the offset LOCOS layer have been grown from the dielectric layer such that a transition between the third segments and the sixth segments is substantially continuous.

9. A semiconductor device according to claim 1 or claim 5, wherein a ratio of the breakdown voltages of the low breakdown voltage transistor and the high breakdown voltage transistor is about 3 to 60.

10. A semiconductor device according to claim 9, wherein the high breakdown voltage transistor has an offset gate structure.

* * * * *